(12) United States Patent
Naniwa et al.

(10) Patent No.: US 11,908,497 B2
(45) Date of Patent: Feb. 20, 2024

(54) HARD DISK DRIVE SUSPENSION PAD PRE-SOLDER SIDEWALLS

(71) Applicant: Western Digital Technologies, Inc., San Jose, CA (US)

(72) Inventors: Irizo Naniwa, Fujisawa (JP); Kenichi Murata, Ebina (JP)

(73) Assignee: Western Digital Technologies, Inc., San Jose, CA (US)

( * ) Notice: Subject to any disclaimer, the term of this patent is extended or adjusted under 35 U.S.C. 154(b) by 11 days.

(21) Appl. No.: 17/707,368

(22) Filed: Mar. 29, 2022

(65) Prior Publication Data

US 2023/0317105 A1 Oct. 5, 2023

(51) Int. Cl.
  *G11B 5/48* (2006.01)
  *H05K 3/40* (2006.01)
  *H05K 1/11* (2006.01)

(52) U.S. Cl.
  CPC ............ *G11B 5/4853* (2013.01); *G11B 5/486* (2013.01); *G11B 5/484* (2013.01); *H05K 1/117* (2013.01); *H05K 3/403* (2013.01); *H05K 2201/10159* (2013.01)

(58) Field of Classification Search
  None
  See application file for complete search history.

(56) References Cited

U.S. PATENT DOCUMENTS

| | | | |
|---|---|---|---|
| 5,815,919 A | 10/1998 | Nakanishi et al. | |
| 8,031,437 B2 | 10/2011 | Suzuki et al. | |
| 8,320,081 B2 | 11/2012 | Chou et al. | |
| 8,587,901 B1 | 11/2013 | Puttichaem et al. | |
| 11,062,731 B1 | 7/2021 | Satoh et al. | |
| 2003/0070834 A1* | 4/2003 | Tsuchiya et al. | G11B 5/4853 174/250 |
| 2005/0199680 A1* | 9/2005 | Matsumoto et al. | G11B 5/4853 228/101 |
| 2006/0139809 A1* | 6/2006 | Matsumoto et al. | G11B 5/4853 360/234.5 |
| 2009/0091860 A1 | 4/2009 | Dela Pena et al. | |

(Continued)

FOREIGN PATENT DOCUMENTS

| | | |
|---|---|---|
| JP | H10335798 A | 12/1998 |
| JP | 5869451 B2 | 2/2016 |

OTHER PUBLICATIONS

Chen, Hongtao et al., Mechanical shock modeling and testing of lead-free solder joint in hard disk drive head assembly, 2005 International Conference on Asian Green Electronics, Session 4, Apr. 2005, pp. 192-196, IEEE Xplore.

*Primary Examiner* — Craig A. Renner
(74) *Attorney, Agent, or Firm* — John D. Henkhaus

(57) ABSTRACT

A hard disk drive flexure assembly includes a base layer, a conductive layer, a plurality of electrical pads over the conductive layer, and a sidewall layer including sidewalls on each side of and extending higher than a corresponding electrical pad. Pre-solder bumps are formed between the sidewalls and over each pad. Use of sidewalls prevents the pre-solder bumps from undesirably bridging to an adjacent electrical pad and forming a short circuit, which might otherwise cause head-gimbal assembly (HGA) manufacturing failures and consequent increased cost. These techniques are especially relevant with narrow, high-density, small pitch electrical pads.

23 Claims, 17 Drawing Sheets

(56) References Cited

U.S. PATENT DOCUMENTS

2010/0321829 A1 12/2010 Hutchinson et al.
2020/0098388 A1 3/2020 Davidson et al.

* cited by examiner

HARD DISK DRIVE SUSPENSION PAD PRE-SOLDER SIDEWALLS

FIELD OF EMBODIMENTS

Embodiments of the invention may relate generally to hard disk drives, and particularly to approaches to pre-solder bump formation for suspension electrical pads.

BACKGROUND

A hard disk drive (HDD) is a non-volatile storage device that is housed in a protective enclosure and stores digitally encoded data on one or more circular disks having magnetic surfaces. When an HDD is in operation, each magnetic-recording disk is rapidly rotated by a spindle system. Data is read from and written to a magnetic-recording disk using a read-write head (or "transducer") housed in a slider that is positioned over a specific location of a disk by an actuator. A read-write head makes use of magnetic fields to write data to and read data from the surface of a magnetic-recording disk. A write head works by using the current flowing through its coil to produce a magnetic field. Electrical pulses are sent to the write head, with different patterns of positive and negative currents. The current in the coil of the write head produces a localized magnetic field across the gap between the head and the magnetic-recording disk, which in turn magnetizes a small area on the recording medium.

To write data to or read data from the recording medium, the head has to receive instructions from a controller. Hence, the head is electrically connected to the controller in some manner such that not only does the head receive instructions to read/write data, but the head can also send information back to the controller regarding the data read and/or written. Typically, a flexible printed circuit (FPC) mounted on a suspension is used to electrically transmit signals from the read-write head to other electronics within an HDD. At one end, the FPC-suspension assembly and the head are electrically connected together typically with solder at the head slider. To connect these components with solder, solder balls between the suspension electrical pads and the slider electrical pads are heated, such as by using a laser in a solder bond jet (SBJ) procedure, for example.

Any approaches that may be described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

BRIEF DESCRIPTION OF THE DRAWINGS

Embodiments are illustrated by way of example, and not by way of limitation, in the figures of the accompanying drawings and in which like reference numerals refer to similar elements and in which.

DETAILED DESCRIPTION

Figure 1:
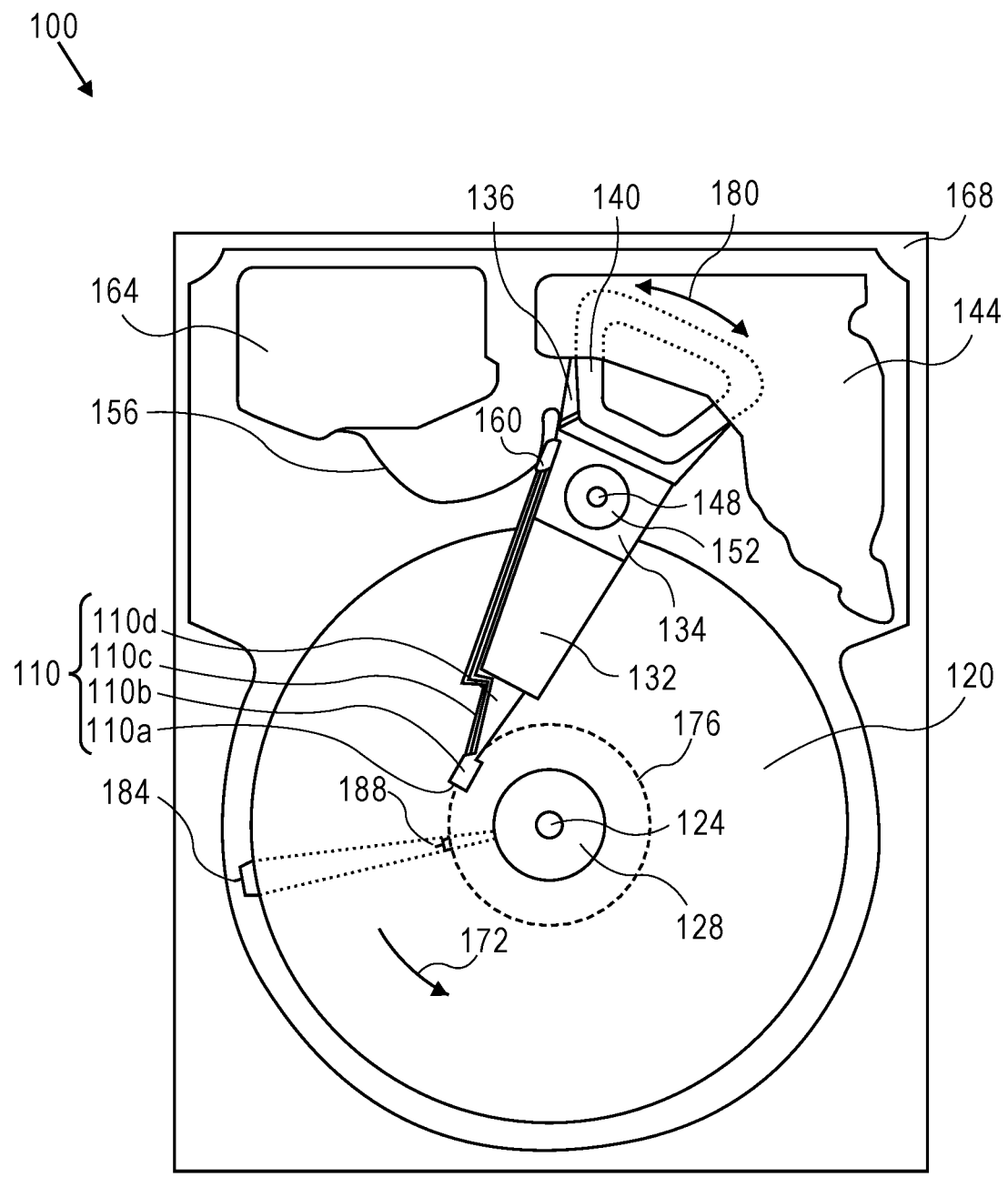
FIG. 1 is a plan view illustrating a hard disk drive, according to an embodiment.

Generally, approaches to formation of pre-solder bumps for suspension flexure electrical pads are described. In the following description, for the purposes of explanation, numerous specific details are set forth in order to provide a thorough understanding of the embodiments of the invention described herein. It will be apparent, however, that the embodiments of the invention described herein may be practiced without these specific details. In other instances, well-known structures and devices may be shown in block diagram form in order to avoid unnecessarily obscuring the embodiments of the invention described herein.

INTRODUCTION

Terminology

References herein to "an embodiment", "one embodiment", and the like, are intended to mean that the particular feature, structure, or characteristic being described is included in at least one embodiment of the invention. However, instances of such phrases do not necessarily all refer to the same embodiment, The term "substantially" will be understood to describe a feature that is largely or nearly structured, configured, dimensioned, etc., but with which manufacturing tolerances and the like may in practice result in a situation in which the structure, configuration, dimension, etc. is not always or necessarily precisely as stated. For example, describing a structure as "substantially vertical" would assign that term its plain meaning, such that the sidewall is vertical for all practical purposes but may not be precisely at 90 degrees throughout.

While terms such as "optimal", "optimize", "minimal", "minimize", "maximal", "maximize", and the like may not have certain values associated therewith, if such terms are used herein the intent is that one of ordinary skill in the art would understand such terms to include affecting a value, parameter, metric, and the like in a beneficial direction consistent with the totality of this disclosure. For example, describing a value of something as "minimal" does not require that the value actually be equal to some theoretical minimum (e.g., zero), but should be understood in a practical sense in that a corresponding goal would be to move the value in a beneficial direction toward a theoretical minimum.

Context

Recall that a flexible printed circuit (FPC) mounted on a suspension is typically used to electrically transmit signals from the read-write head to other electronics within a hard disk drive (HDD), that the FPC-suspension assembly and the head are electrically connected together with solder at the head slider via connection pads on the respective components. The number of slider electrical connections, and thus the number of connection pads on the slider and the flexure of the suspension, is expected to increase over time due to the implementation of new technologies such as dual thermal flying height control (TFC), two-dimensional magnetic recording (TDMR), energy-assisted magnetic recording (EAMR) such as heat-assisted magnetic recording (HAMR), microwave-assisted magnetic recording (MAMR), and the like. Consequently, to make room for the additional connection pads the distance between adjacent pads is expected to narrow (or decrease) and the size of the pads is expected to decrease accordingly, including narrowing the pads to inhibit undesirable solder bridges (e.g., electrical bonds) between adjacent pads. Hence, as the pads increase in number it becomes more difficult to connect the pads as needed using the traditional SBJ solder balls, equipment and procedures.

Figure 2A:
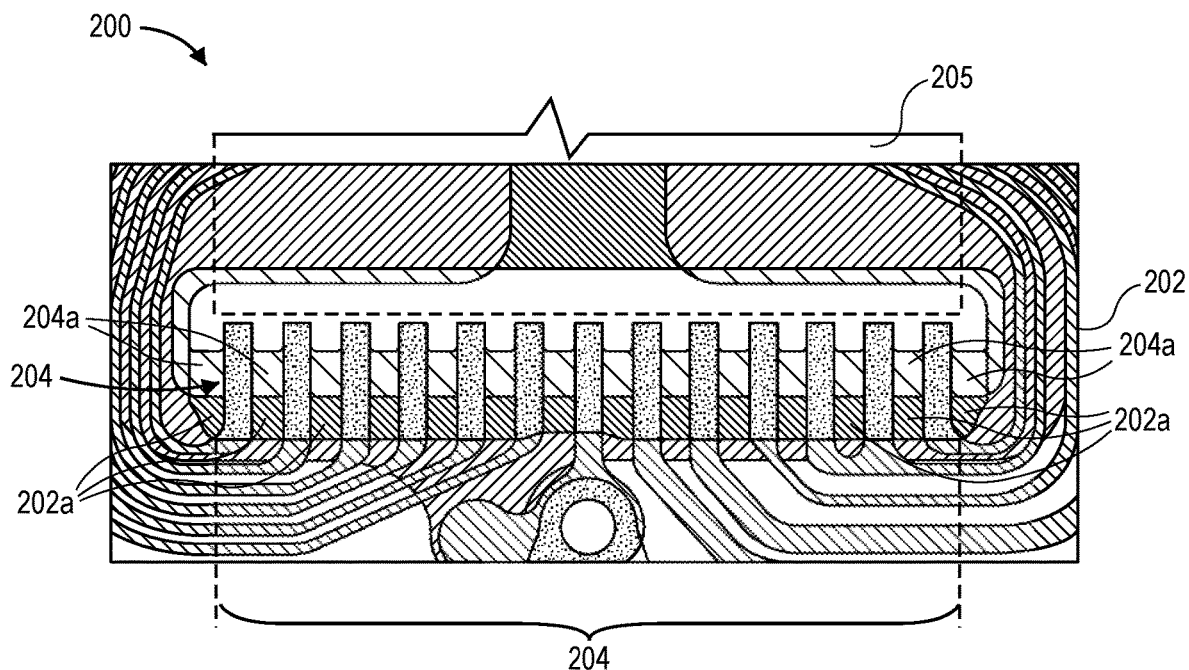
FIG. 2A is a top view illustrating a 13-pad configuration for a suspension flexure, according to an embodiment.
Figure 2B:
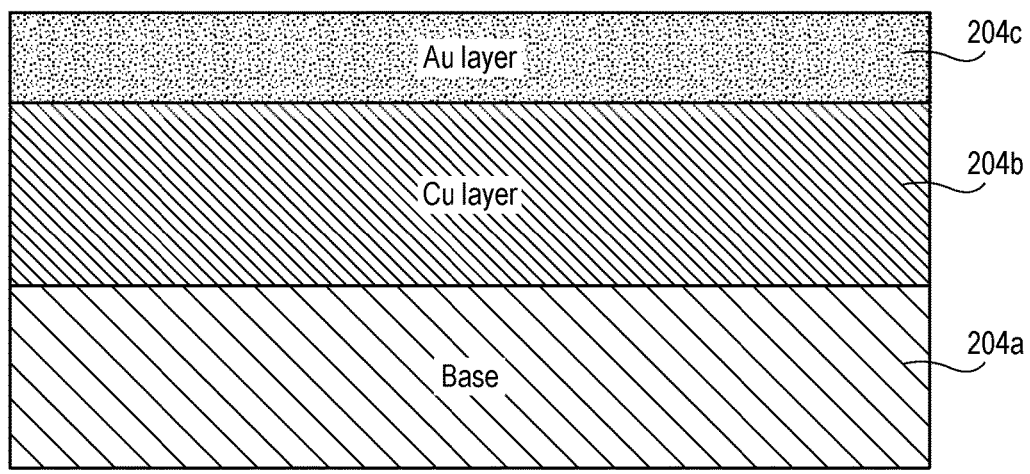
FIG. 2B is a cross-sectional side view illustrating the construction of a flexure electrical pad of FIG. 2A, according to an embodiment.

FIG. 2A is a top view illustrating a 13-pad configuration for a suspension flexure, and FIG. 2B is a cross-sectional side view illustrating the construction of a flexure electrical pad of FIG. 2A, both according to an embodiment. The suspension flexure (or simply "flexure") pad configuration 200 of FIGS. 2A-2B comprises a flexure 202, on which a plurality of electrical connection pads 204 (or simply "electrical pads", "connection pads", "bond pads" or "pads") are coupled. A head slider 205 is also depicted in FIG. 2A in phantom for reference purpose. The flexure 202 of configuration 200 comprises surface(s) such as PI layer 202a (only some of which are labeled, for clarity) typically composed of the polyimide ("PI") polymer. The pad 204 configuration comprises a pad base layer 204a which supports a copper layer 204b (or "Cu layer") on which lies a gold layer 204c (or "Au layer").

As discussed, it is becoming more and more challenging to connect slider pads to flexure pads using SBJ solder balls, equipment and procedures. Therefore, the use of "pre-solder" processes to form "pre-solder bumps" of solder material (e.g., a metal alloy, commonly composed of tin-lead (Sn—Pb), or a lead-free material), instead of SBJ is contemplated. "Pre-solder" generally refers to pre-forming solder bumps onto a pad prior to a reflow-based component bonding procedure. In the context of FIG. 2A that would mean that pre-solder bumps of solder material are formed onto or over each pad 204, so that each pre-solder bump can be heated to reflow to then electrically bond with a corresponding slider pad. There are at least two types of pre-solder processes using photoresist that are under consideration for this pre-solder purpose, "solder plating" and "solder paste printing and reflow". Generally with a metal plating process, a material is in some way deposited (e.g., spraying, electroplating, electroless plating, and the like) onto a workpiece. Generally with a solder paste printing process, a solder material is in some way spread onto a workpiece with a squeegee through a mask (e.g., stencil, photoresist, and the like) and then reflowed by heating to take a desirable form.

Solder bumps on flexure tail-pads are currently formed with solder paste printing and reflow using metal mask, but the metal mask is not considered a good candidate for forming the bumps on flexure head-pads because a head-pad is smaller than the tail-pad and the pattern pitch is also narrower. Furthermore, pre-solder process using photoresist has some challenges, and it is difficult to apply to mass production of flexures. For example, the flexure may be undesirably deformed in the resist patterning and/or the resist stripping after solder bump formation. In the case of film resist (not liquid), the film attachment procedure may also cause flexure deformation. In any case, the pre-solder may be damaged in the resist stripping procedure and/or resist residue may remain after resist stripping.

Method for Manufacturing a Hard Disk Drive Flexure Assembly

Figure 4A:
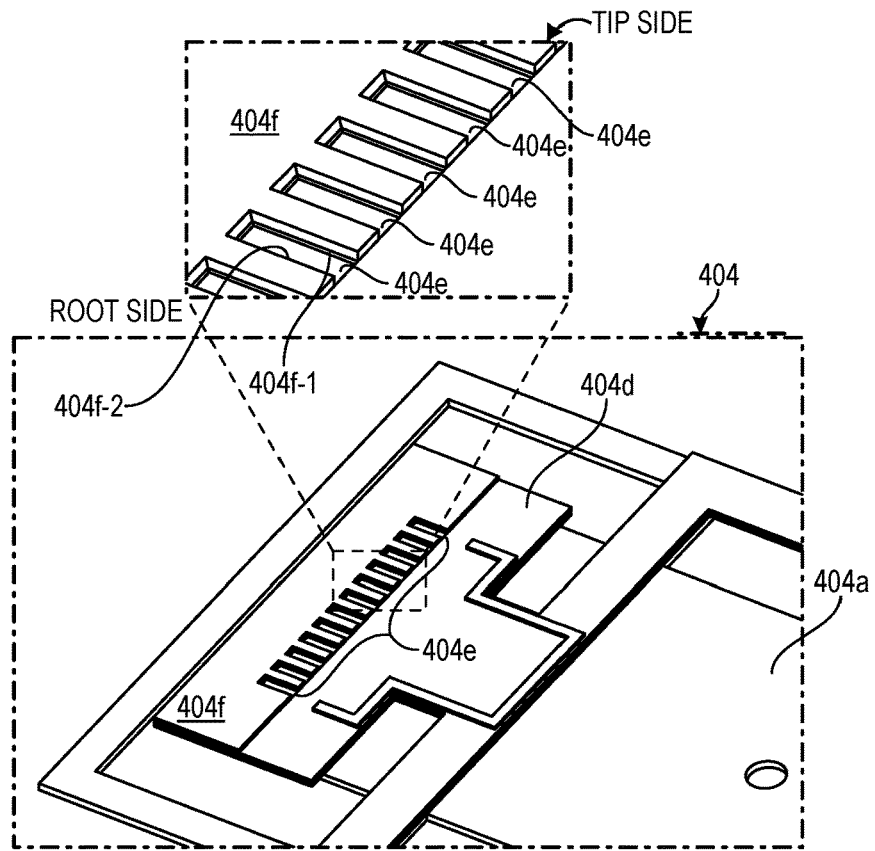
FIG. 4A-D are perspective views illustrating a multi-stage pre-solder solder plating process for a flexure assembly, according to an embodiment.
Figure 4B:
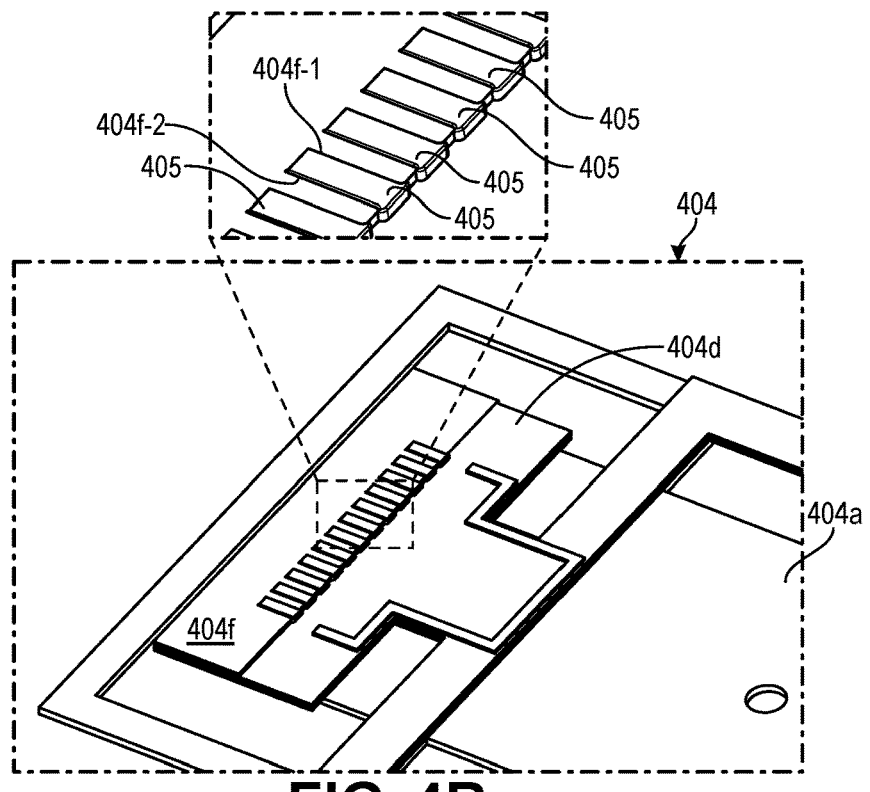
Figure 4C:
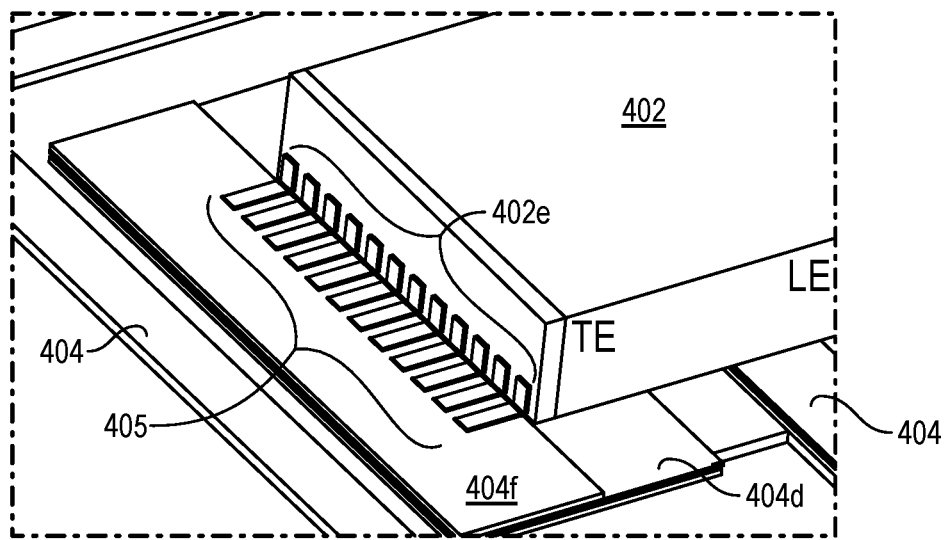
Figure 4D:
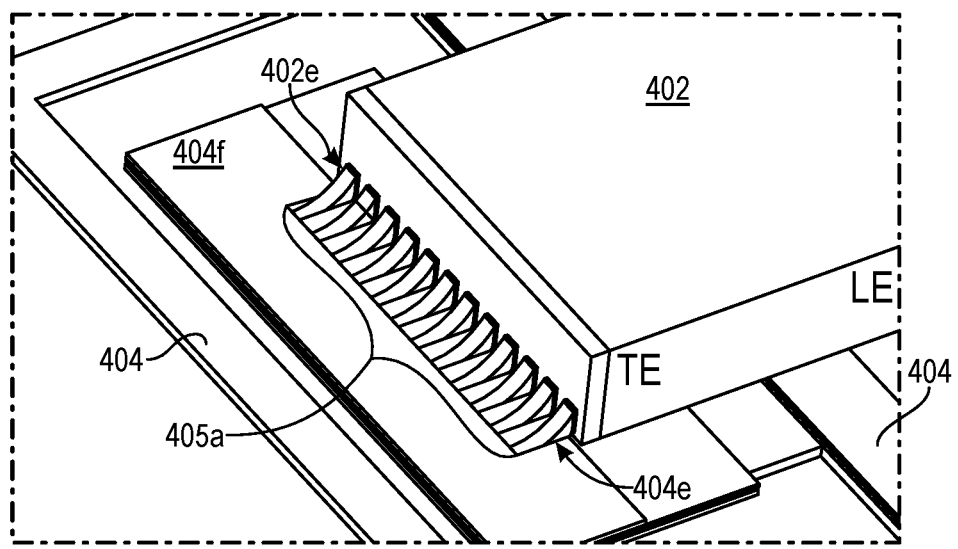

FIG. 4A-D are perspective views illustrating a multi-stage pre-solder solder plating process for a flexure assembly, according to an embodiment. FIG. 4A depicts a flexure forming stage, in which a sidewall layer 404f (or generally, "sidewalls 404f"), e.g., a polyimide (PI) polymer layer, comprising a plurality of sidewalls such as 404f-1, 404f-2 (only a subset labeled here, for clarity) are formed around each flexure electrical pad 404e (here, a head-pad rather than a tail-pad), where each pad 404e has a root side and a tip side as shown and the set of pads 404e are laid out in a lateral direction. According to an embodiment, sidewalls 404f are formed at the two lateral sides and the root side of each pad 404e. The sidewalls 404f are positioned over an insulative cover layer 404d (e.g., a PI layer) over a metal substrate 404a (e.g., an etched stainless steel (SST) layer), where a conductive printed circuit layer (not visible here under the cover layer 404d) and an insulative base layer (not visible here under the cover layer 404d) may be formed therebetween. The pads 404e are positioned over the conductive printed circuit layer. FIG. 4B depicts a solder plating stage, in which pre-solder bumps 405 are formed over each electrical pad 404e and between the respective sidewalls 404f of the flexure 404. FIG. 4C depicts a slider attach stage, in which a slider 402 is adhered to the flexure 404. FIG. 4D depicts a pad connection stage, in which solder fillets 405a are formed by reflowing the pre-solder bumps 405 of the flexure 404 using a heat source (e.g., laser irradiation), to electrically interconnect slider 402 electrical pads 402e with the corresponding flexure 404 electrical pads 404e.

Use of sidewalls 404f prevents the pre-solder bumps 405 (as well as the finished solder fillets 405a to some extent) from bridging to an adjacent electrical pad 404e and forming a short circuit. While the pre-solder bump 405 plating may form in the longitudinal direction from the tip side of the flexure pads 405e because the sidewalls 404f are not formed at the tip, this is considered controllable with proper design and configuration of the pads 404e and sidewalls 404f. According to embodiments, the sidewalls 404f may be formed as a sidewall layer, as depicted, and are not stripped away after formation of the pre-solder bumps 405 (see, e.g., FIG. 4C-D).

Figure 3:
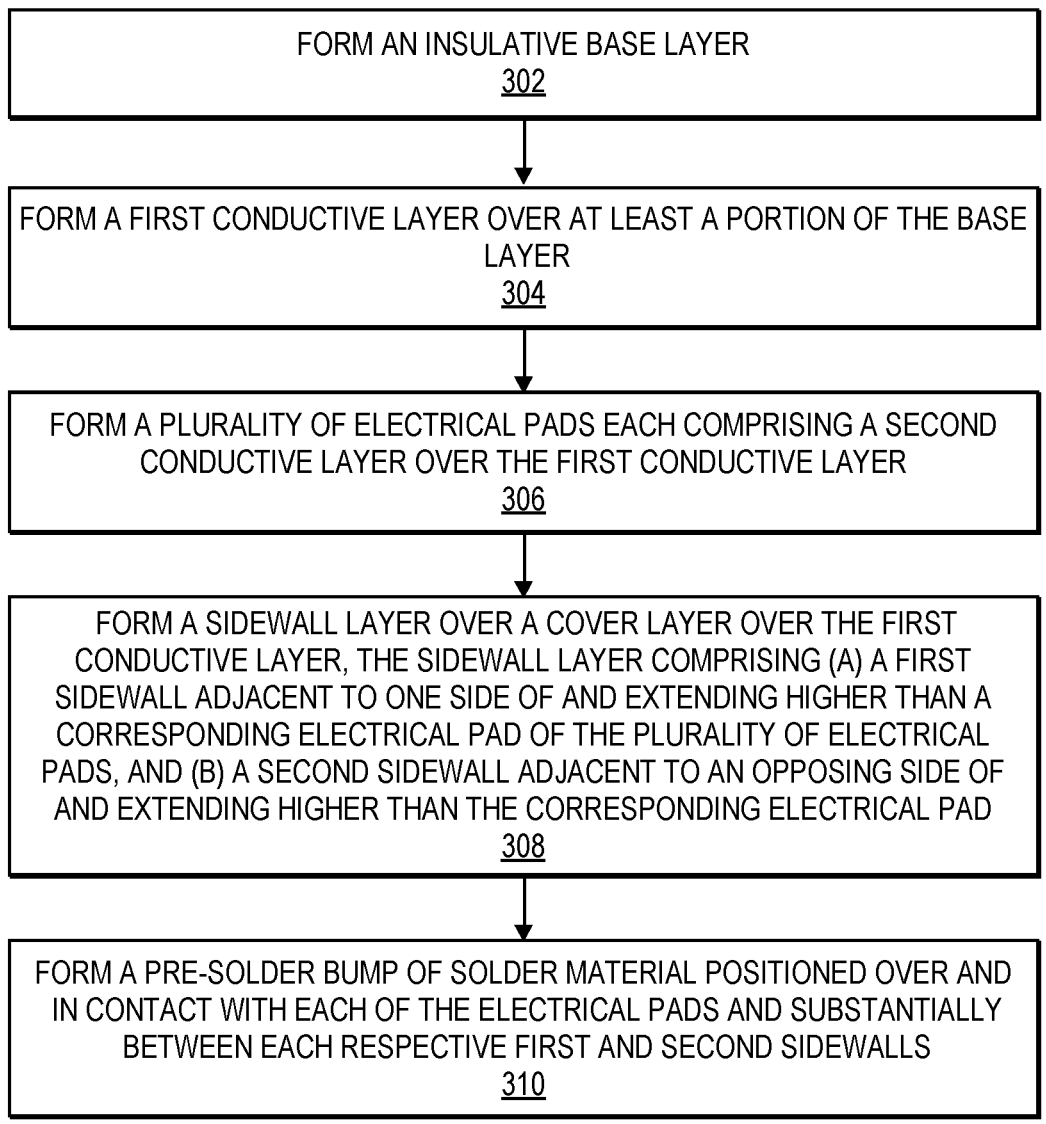
FIG. 3 is a flow diagram illustrating a method of manufacturing a hard disk drive flexure assembly, according to an embodiment.

FIG. 3 is a flow diagram illustrating a method of manufacturing a flexure assembly for a hard disk drive, according to an embodiment. For example, blocks 302-310 may be utilized to form a flexure part or component of a lead suspension for installation into a hard disk drive. FIG. 4A-D are referenced for a non-limiting illustrative example implementation of the method of FIG. 3.

At block 302, form an insulative base layer. For example, a base layer such as a polyimide polymer layer (see also base layer 204a of FIGS. 2A-2B) is formed over the metal substrate 404a according to known manufacturing process techniques.

At block 304, form a first conductive layer over at least a portion of the base layer. For example, a first conductive layer such as a copper printed circuit layer (see also copper layer 204b of FIG. 2B, and conductive layer 504c, 604c, 1004c of FIGS. 5, 6, 10) is formed over the base layer according to known manufacturing process techniques.

At block 306, form a plurality of electrical pads each comprising a second conductive layer over the first conductive layer. For example, a plurality of electrical pads 404e each comprising a second conductive layer, such as a gold layer (see also gold layer 204c of FIG. 2B), are formed over the first conductive layer according to known manufacturing process techniques. As described in reference to FIG. 4C-D, the head slider 402 comprises a corresponding plurality of electrical pads 402e, located on a trailing edge (TE) opposite a leading edge (LE) of the slider 402, to which the plurality of electrical pads 404e of the flexure 404 are electrically connected.

At block 308, form a sidewall layer over a cover layer over the first conductive layer, where the sidewall layer comprises (a) a first sidewall adjacent to one side of and extending higher than a corresponding electrical pad of the plurality of electrical pads, and (b) a second sidewall adjacent to an opposing side of and extending higher than the corresponding electrical pad. For example, sidewall layer 404f is formed over the cover layer 404d over the first conductive layer, where the sidewall layer comprises (a) a first sidewall 404f-1 adjacent to one side of and extending higher than a corresponding electrical pad of the plurality of electrical pads 404e, and (b) a second sidewall 404f-2 adjacent to an opposing side of and extending higher than the corresponding electrical pad 404e.

At block 310, form a pre-solder bump of solder material positioned over and in contact with each of the electrical pads. For example, a pre-solder bump 405 of solder material is formed over at least a portion of and in contact with each of the electrical pads 404e of the flexure 404 according to known manufacturing process techniques. For non-limiting examples, solder plating or solder paste printing and reflow techniques may be used to form each pre-solder bump 405.

As discussed, use of sidewalls 404f prevents the pre-solder bumps 405 from undesirably bridging to an adjacent electrical pad 404e and forming a short circuit, which might otherwise cause head-gimbal assembly (HGA) manufacturing failures and consequent increased cost. The techniques described herein are especially useful in relatively high-density, small pitch, narrow electrical pads, such as in a configuration of thirteen or more pads.

Solder Plating Pre-Solder Bump Formation for Flexure Assembly

Figure 5A:
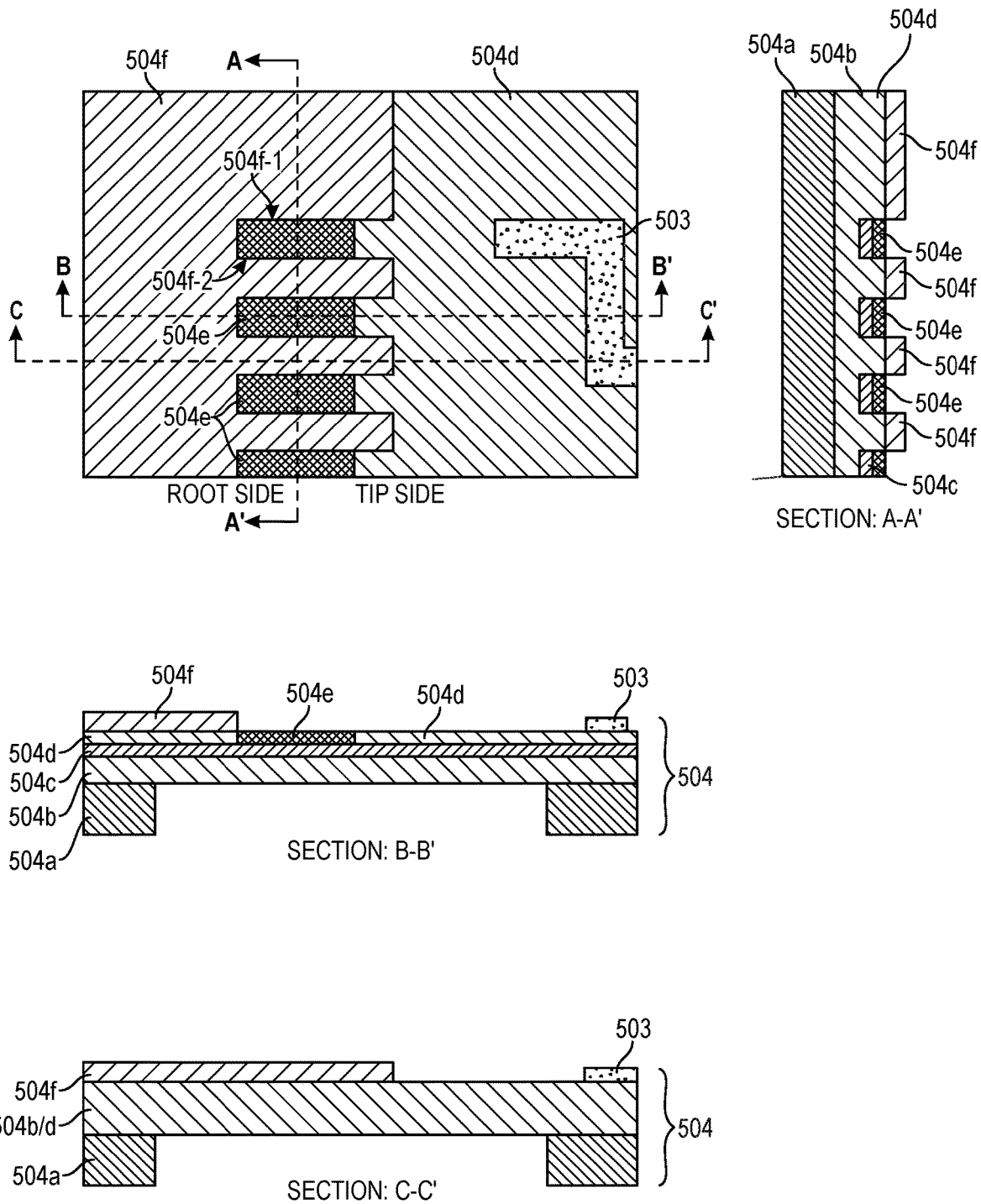
FIG. 5A-C are diagrams illustrating a multi-stage protruding-sidewall pre-solder solder plating process for a flexure assembly, according to an embodiment.
Figure 5B:
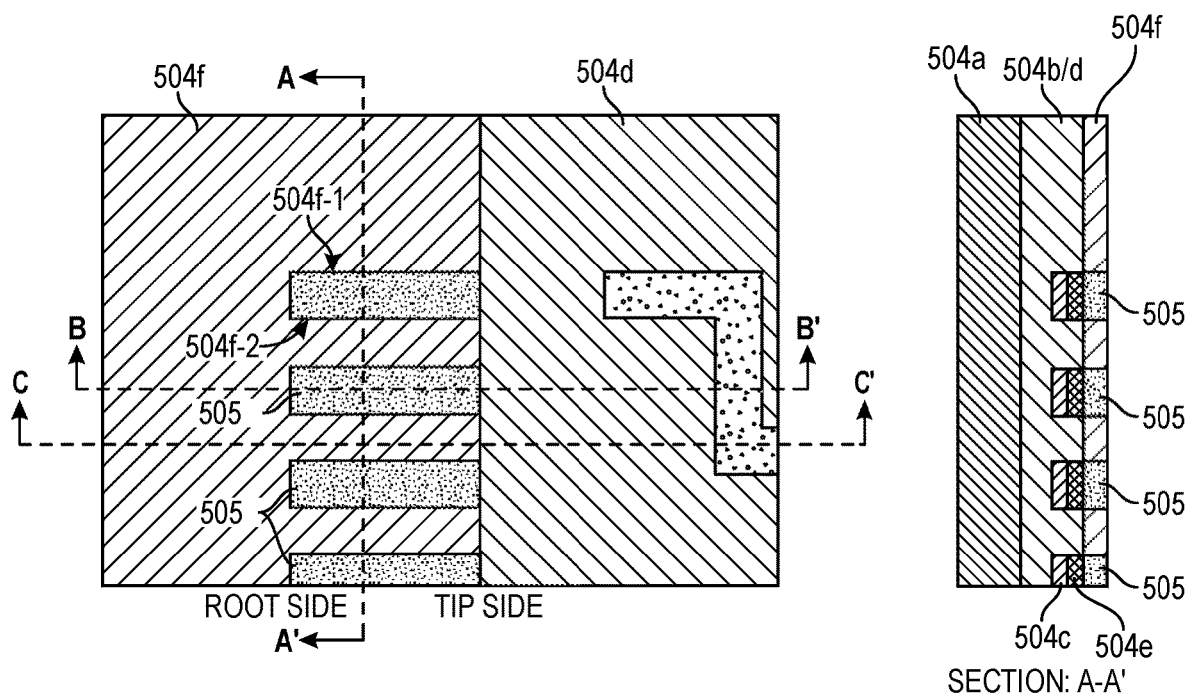
Figure 5B:
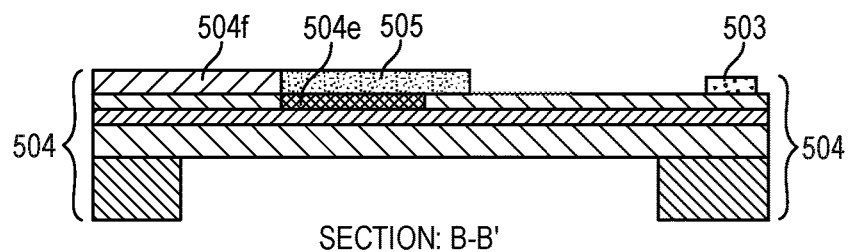
Figure 5B:
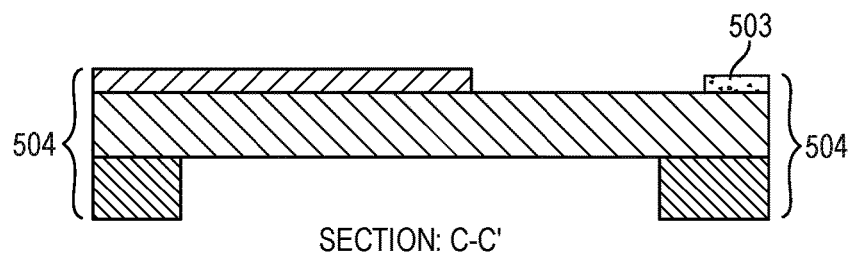
Figure 5C:
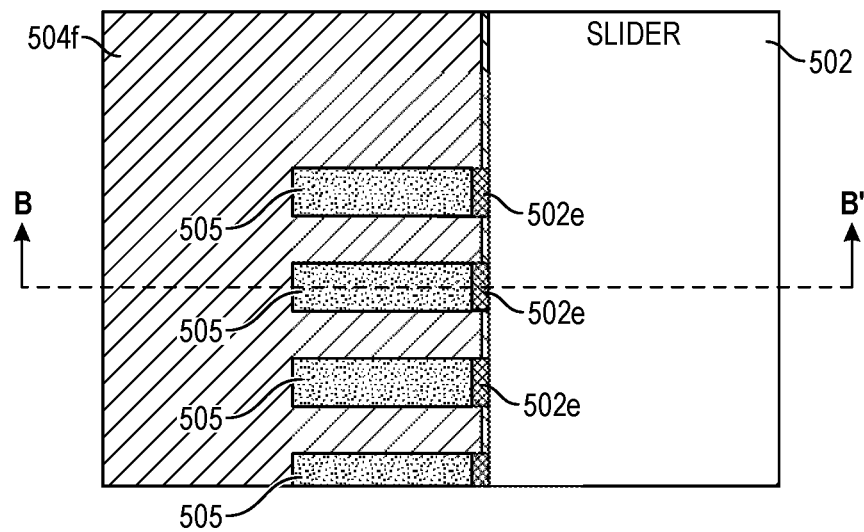
Figure 5C:
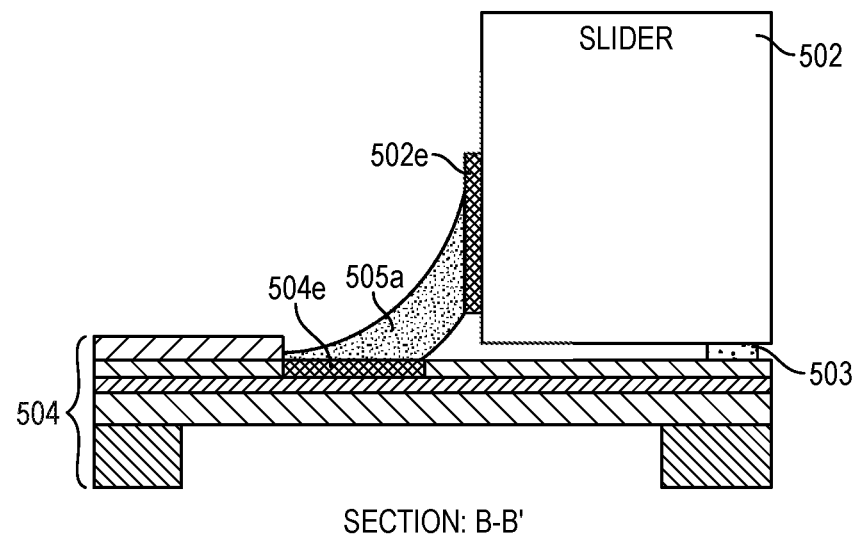

FIG. 5A-C are diagrams illustrating a multi-stage protruding-sidewall pre-solder solder plating process for a flexure assembly, according to an embodiment, in which the sidewalls on two sides of each electrical pad protrude beyond the tip side of the pad. FIG. 5A depicts a flexure forming stage, in which a sidewall layer 504f (or generally, "sidewalls 504f"), e.g., a polyimide (PI) polymer layer, comprising a plurality of sidewalls such as 504f-1, 504f-2 (only a subset labeled here, for clarity) are formed around each flexure electrical pad 504e (here, a head-pad), where each pad 504e has a root side and a tip side as shown and the set of pads 504e are laid out in a lateral direction. The sidewalls 504f are positioned over an insulative cover layer 504d (e.g., a PI layer) over a metal substrate 504a (e.g., an etched stainless steel (SST) layer), where a conductive printed circuit layer 504c and an insulative base layer 504b may be formed at some locations therebetween. The pads 504e are positioned over the conductive printed circuit layer 504c. Here, the sidewalls 504f are formed at the two lateral sides and the root side of each pad 504e and, according to this embodiment, the sidewalls 504f-1, 504f-2 extend or protrude beyond the tip side of the pad 504e.

FIG. 5B depicts a solder plating stage, in which pre-solder bumps 505 are formed over each electrical pad 504e and between the respective sidewalls 504f of the flexure 504. With this "protruding-sidewall" pre-solder bump formation process, the risk of a short circuit to an adjacent electrical pad by solder plating process is further reduced. FIG. 5C depicts a pad connection stage, in which solder fillets 505a are formed by reflowing the pre-solder bumps 505 of the flexure 504 using a heat source (e.g., laser irradiation), to electrically interconnect electrical pads 502e of a slider 502 (e.g., adhered to stud 503) with the corresponding electrical pads 504e of the flexure 504.

Figure 6A:
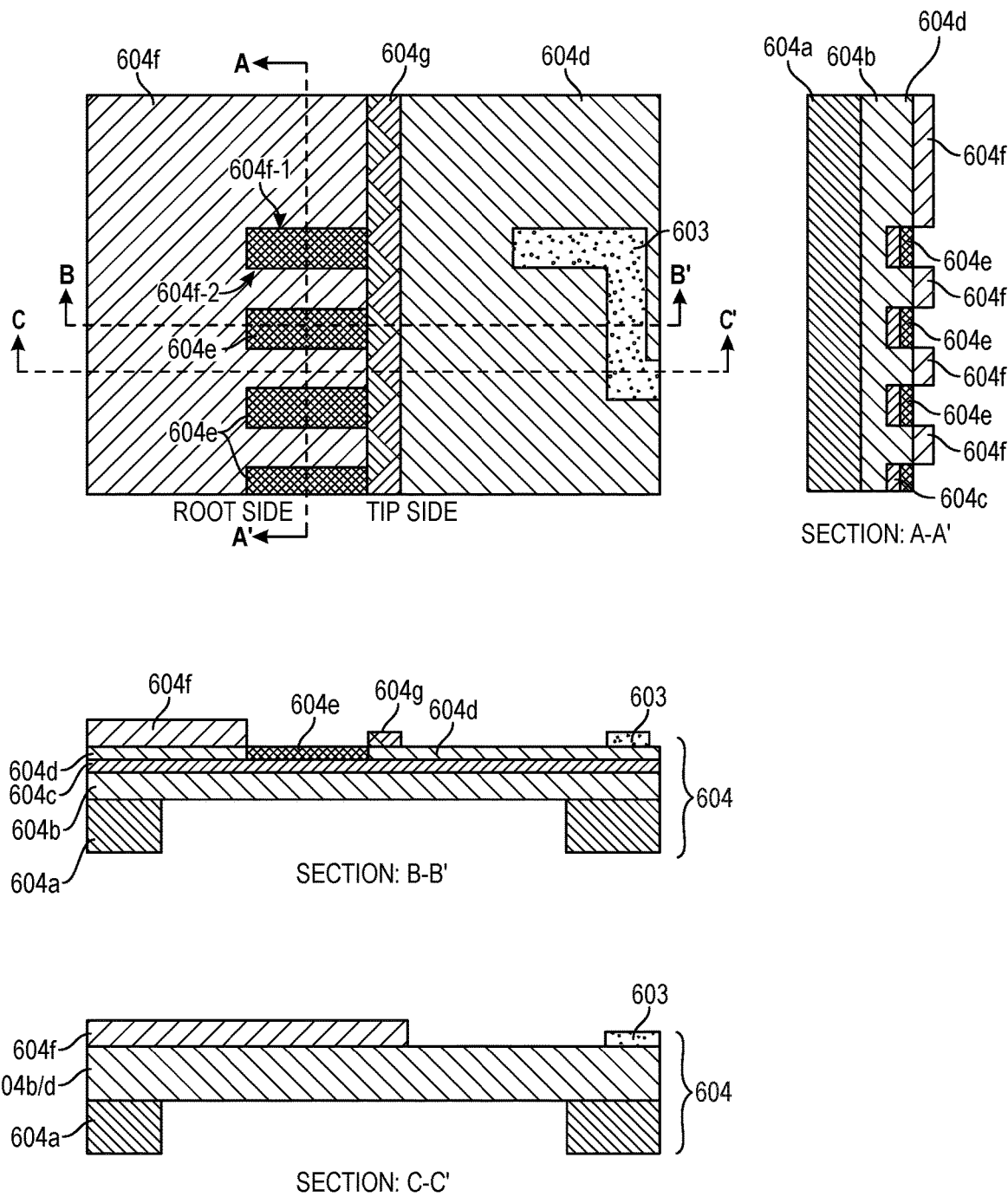
FIG. 6A-C are diagrams illustrating a multi-stage stepped pre-solder solder plating process for a flexure assembly, according to an embodiment.
Figure 6B:
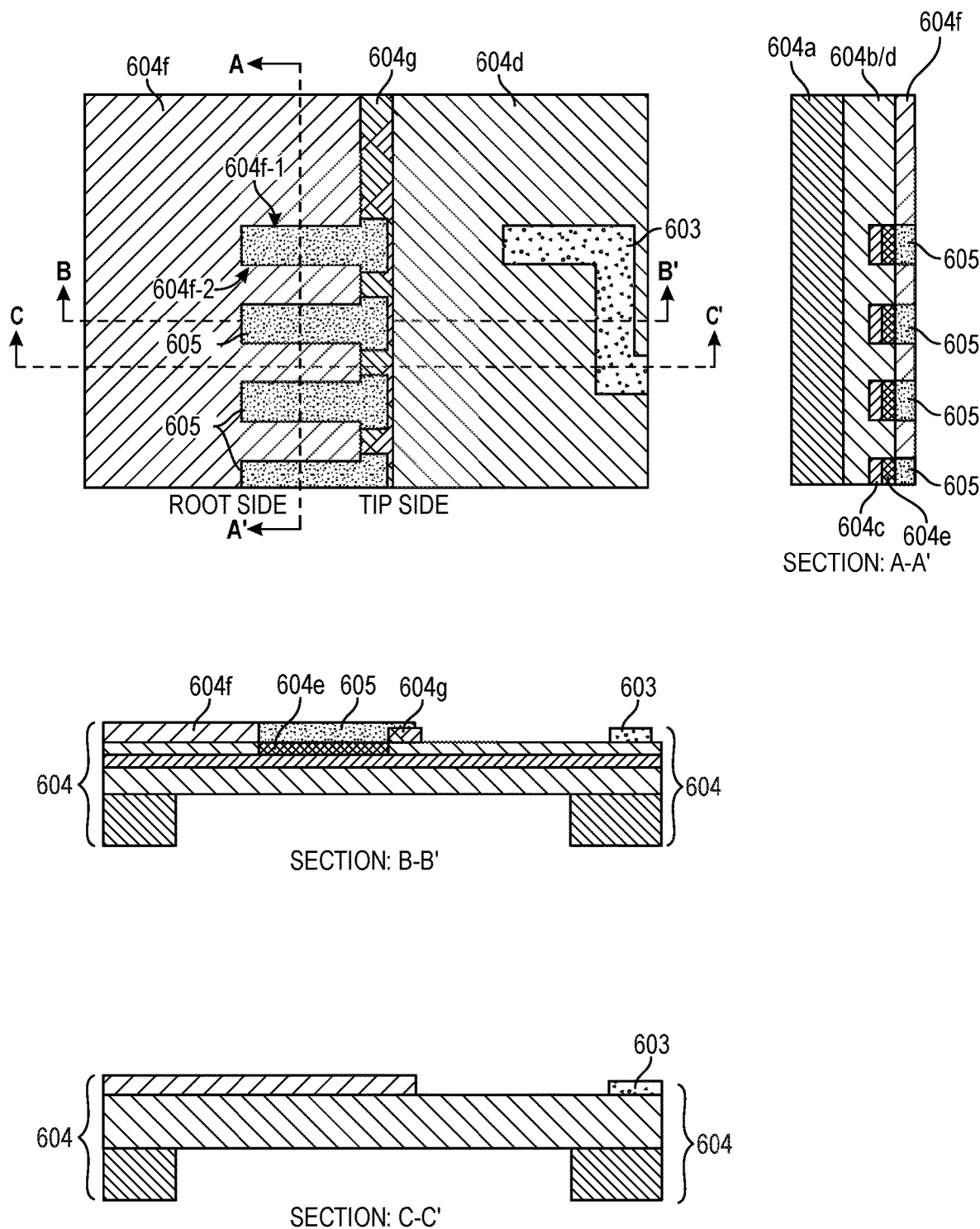
Figure 6C:
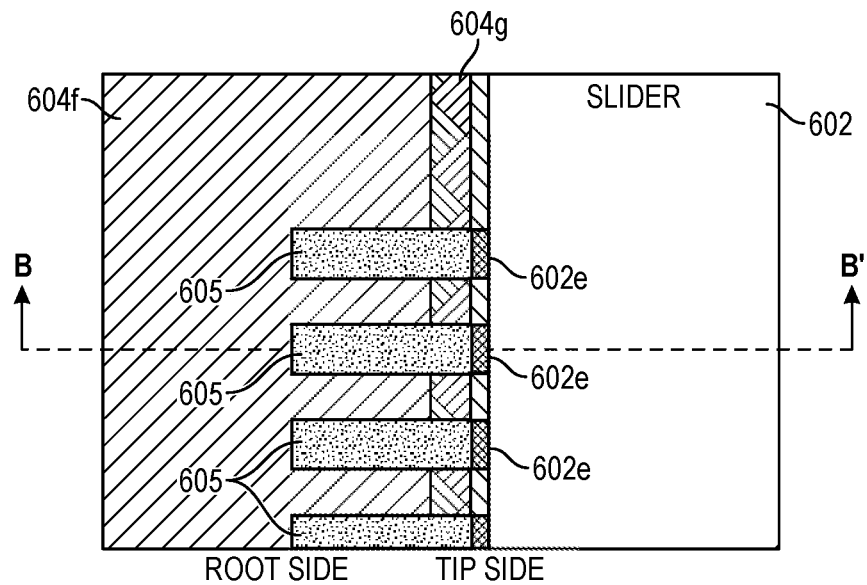
Figure 6C:
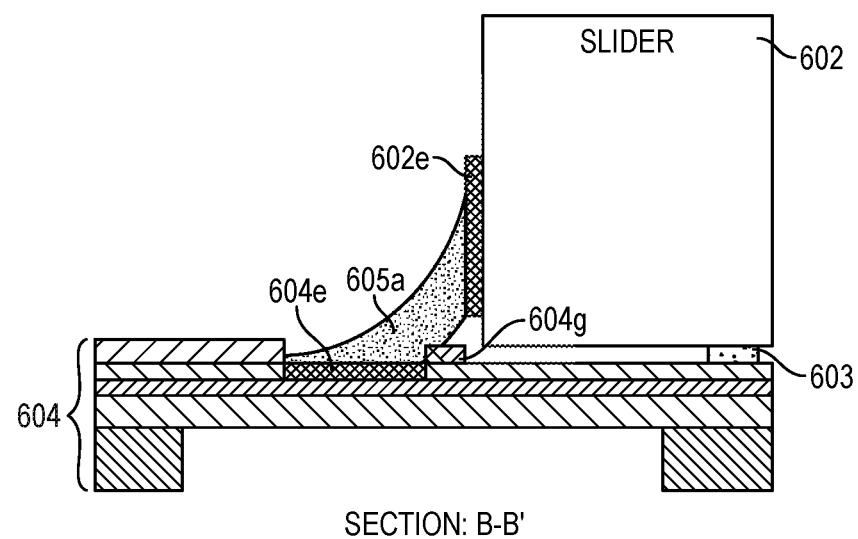

FIG. 6A-C are diagrams illustrating a multi-stage stepped pre-solder solder plating process for a flexure assembly, according to an embodiment, in which a shallow step structure is formed on the tip side edge of the pad. FIG. 6A depicts a flexure forming stage, in which a sidewall layer 604f (or generally, "sidewalls 604f"), e.g., a polyimide (PI) polymer layer, comprising a plurality of sidewalls such as 604f-1, 604f-2 (only a subset labeled here, for clarity) are formed around each flexure electrical pad 604e (here, a head-pad), where each pad 604e has a root side and a tip side as shown and the set of pads 604e are laid out in a lateral direction. The sidewalls 604f are positioned over an insulative cover layer 604d (e.g., a PI layer) over a metal substrate 604a (e.g., an etched stainless steel (SST) layer), where a conductive printed circuit layer 604c and an insulative base layer 604b may be formed at some locations therebetween. The pads 604e are positioned over the conductive printed circuit layer 604c. Here, the sidewalls 604f are formed at the two lateral sides and the root side of each pad 604e and, according to this embodiment, are bounded at the tip side edge of each pad 604e by a step (or stepped) structure 604g. Step structure 604g is configured to be lower in height than the sidewall layer 604f.

FIG. 6B depicts a solder plating stage, in which pre-solder bumps 605 are formed over each electrical pad 604e between the respective sidewalls 604f and over at least a portion of the step structure 604g of the flexure 604. With this "stepped" pre-solder bump formation process, the risk of a short circuit to an adjacent electrical pad by solder plating process is further reduced, and the portion of the pre-solder bump 605 over the step structure 604g is higher and therefore presented closer or nearer to each corresponding electrical pad 602e of slider 602 to provide for easier more reliable pad connection. FIG. 6C depicts a pad connection stage, in which solder fillets 605a are formed by reflowing the pre-solder bumps 605 of the flexure 604 using a heat source (e.g., laser irradiation), to electrically interconnect electrical pads 602e of a slider 602 (e.g., adhered to stud 603) with the corresponding electrical pads 604e of the flexure 604.

Figure 7A:
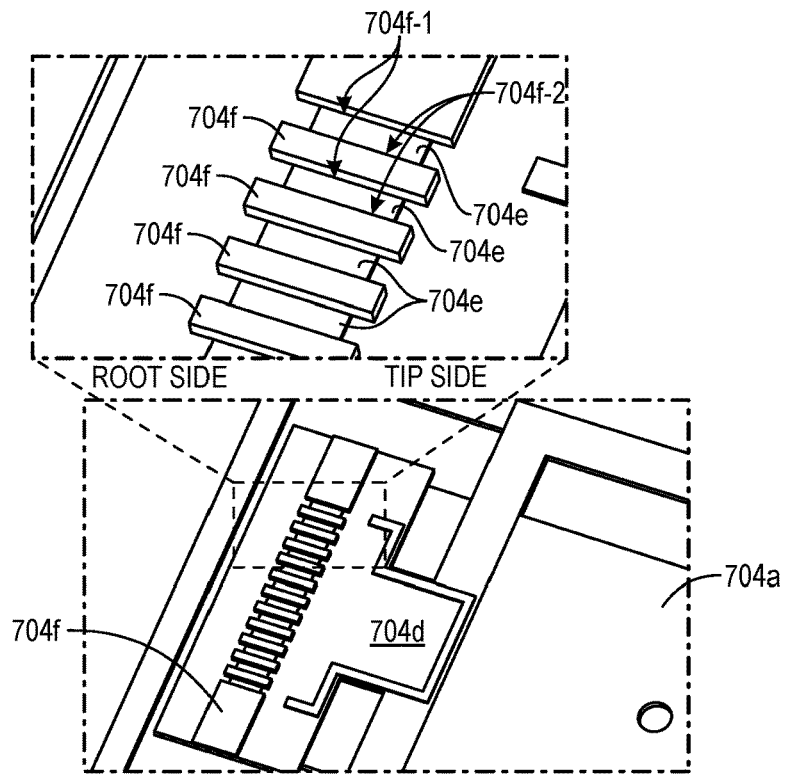
FIG. 7A-B are perspective views illustrating a multi-stage protruding-sidewall pre-solder solder plating process for a flexure assembly, according to an embodiment.
Figure 7B:
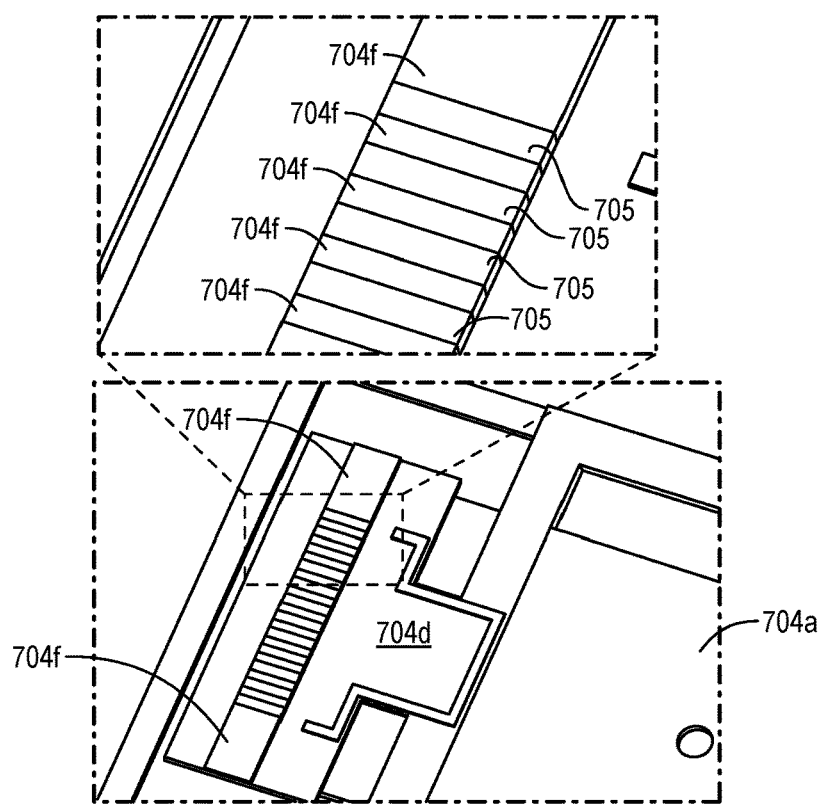

FIG. 7A-B are perspective views illustrating a multi-stage protruding-sidewall pre-solder solder plating process for a flexure assembly, according to an embodiment, in which the sidewalls on two sides of each electrical pad protrude beyond the tip side and the root side of the pad, and with no sidewall along the root side of the pad as in other embodiments. FIG. 7A depicts a flexure forming stage, in which a sidewall layer 704f (or generally, "sidewalls 704f"), e.g., a polyimide (PI) polymer layer, comprising a plurality of sidewalls such as 704f-1, 704f-2 (only a subset labeled here, for clarity) are formed on each lateral side of each flexure electrical pad 704e (here, a head-pad), where each pad 704e has a root side and a tip side as shown and the set of pads 704e are laid out in a lateral direction. The sidewalls 704f are positioned over an insulative cover layer 704d (e.g., a PI layer) over a metal substrate 704a (e.g., an etched stainless steel (SST) layer), where a conductive printed circuit layer (not visible here under the cover layer 704d) and an insulative base layer (not visible here under the cover layer 704d) may be formed at some locations therebetween. The pads 704e are positioned over the conductive printed circuit layer. Here, the sidewalls 704f are formed at the two lateral sides and not the root side of each pad 704e and, according to this embodiment, the sidewalls 704f-1, 704f-2 extend or protrude beyond the tip side and the root side of the pad 704e.

FIG. 7B depicts a solder plating stage, in which pre-solder bumps 705 are formed over each electrical pad 704e and between the respective sidewalls 704f of the flexure 704. Here again, with this "protruding-sidewall" pre-solder bump formation process, the risk of a short circuit to an adjacent electrical pad by solder plating process is further reduced.

Figure 8A:
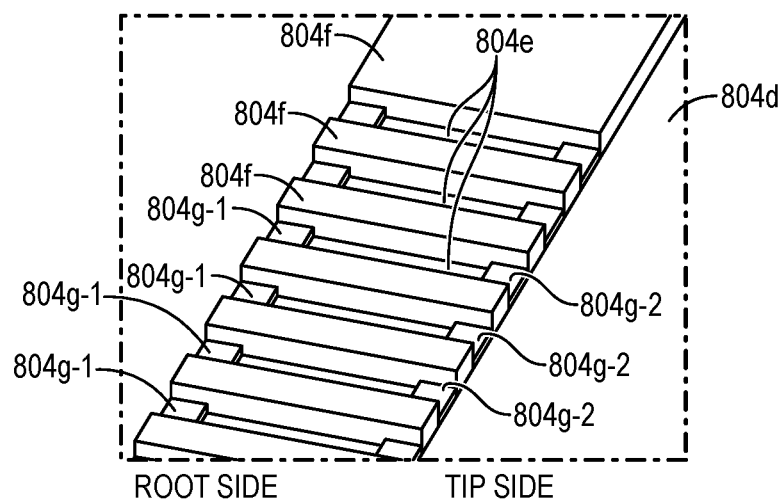
FIG. 8A-B are perspective views illustrating a multi-stage stepped pre-solder solder plating process for a flexure assembly, according to an embodiment.
Figure 8B:
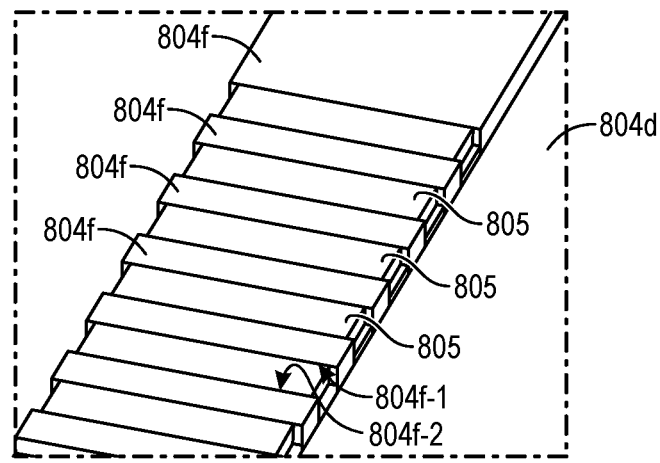

FIG. 8A-B are perspective views illustrating a multi-stage stepped pre-solder solder plating process for a flexure assembly, according to an embodiment, in which the sidewalls on two sides of each electrical pad protrude beyond the tip side and the root side of the pad, with no sidewall along the root side of the pad as in other embodiments, and in which a shallow step structure is formed on each of the root side edge and the tip side edge of the pad. As such, the embodiments of FIG. 8A-B are similar to a combination of the embodiments of FIG. 6A-C and the embodiments of FIG. 7A-B, with an additional step structure at the root side edge of each pad. FIG. 8A depicts a flexure forming stage, in which a sidewall layer 804f (or generally, "sidewalls 804f"), e.g., a polyimide (PI) polymer layer, comprising a plurality of sidewalls such as 804f-1, 804f-2 (only a subset labeled in FIG. 8B, for clarity) are formed on each lateral side of each flexure electrical pad 804e (here, a head-pad), where each pad 804e has a root side and a tip side as shown and the set of pads 804e are laid out in a lateral direction. The sidewalls 804f are positioned over an insulative cover layer 804d over a metal substrate (not visible here under the cover layer 804d but shown in other figures herein), where a conductive printed circuit layer (not visible here under the cover layer 804d but shown in other figures herein) and an insulative base layer (not visible here under the cover layer 804d but shown in other figures herein) may be formed at some locations therebetween. The pads 804e are positioned over the conductive printed circuit layer. Here, the sidewalls 804f are formed at the two lateral sides but not the root side of each pad 804e as with other embodiments and, according to this embodiment, the sidewalls 804f-1, 804f-2 extend or protrude beyond the tip side and the root side of the pad 804e, and are interposed at the tip side edge and at the root side edge of each pad 804e by a step (or stepped) structure 804g-1, 804g-2. Each step structure 804g-1, 804g-2 is configured to be lower in height than the sidewall layer 804f.

FIG. 8B depicts a solder plating stage, in which pre-solder bumps 805 are formed over each electrical pad 804e and between the respective sidewalls 804f and over at least a portion of each step structure 804g-1, 804g-2 of the flexure 804. Here again, with this "protruding-sidewall" aspect of the pre-solder bump formation process the risk of a short circuit to an adjacent electrical pad by solder plating process is reduced, and with this "stepped" aspect of the pre-solder bump formation process the risk of a short circuit to an adjacent electrical pad by solder plating process is further reduced, and the portion of the pre-solder bump 805 over the tip-side step structure 804g-2 is higher and therefore presented closer or nearer to each corresponding electrical pad of a slider to provide for easier more reliable pad connection.

Solder Paste and Reflow Pre-Solder Bump Formation for Flexure Assembly

FIG. 9A-E are perspective views illustrating a multi-stage pre-solder solder paste and reflow process for a flexure assembly, according to an embodiment. As discussed, solder plating or solder paste printing and reflow techniques may be used to form each pre-solder bump, which may employ some form of masking such as a photoresist (or simply "resist"), in order to properly position the pre-solder bump solder material where desired, i.e., for solder patterning. While the foregoing embodiments illustrated and described with reference to FIGS. 5A-8B are described in the context of forming pre-solder bumps using solder plating processes, the following embodiments illustrated and described with reference to FIGS. 9A-10C are described in the context of forming pre-solder bumps using solder paste printing and reflow processes employing a mask, such as a resist.

Figure 9A:
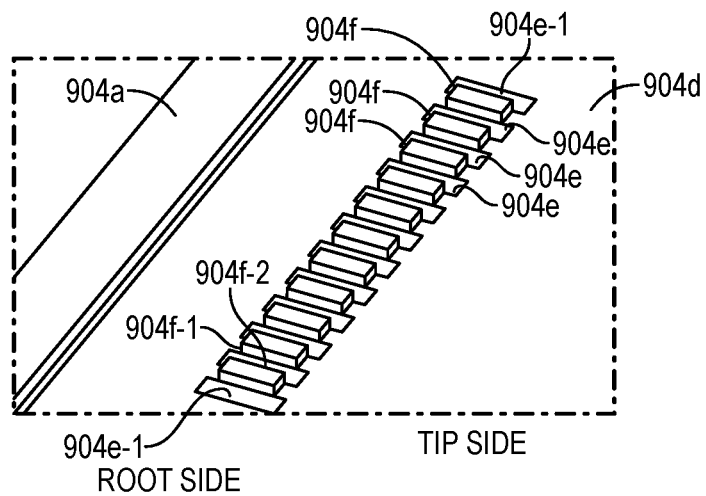
FIG. 9A-E are perspective views illustrating a multi-stage pre-solder solder paste and reflow process for a flexure assembly, according to an embodiment.

FIG. 9A depicts a flexure forming stage, in which a sidewall layer 904f (or generally, "sidewalls 904f"), e.g., a polyimide (PI) polymer layer, comprising a plurality of sidewalls such as 904f-1, 904f-2 (only a subset labeled here, for clarity) are formed on each lateral side of each inner flexure electrical pad 904e (here, a head-pad) but with only an inner sidewall on each outer pad 904e-1, where each pad 904e has a root side and a tip side as shown and the set of pads 904e are laid out in a lateral direction. The sidewalls 904f are positioned over an insulative cover layer 904d (e.g., a PI layer) over a metal substrate 904a (e.g., an etched stainless steel (SST) layer), where a conductive printed circuit layer (not visible here under the cover layer 904d but shown in other figures herein) and an insulative base layer (not visible here under the cover layer 904d but shown in other figures herein) may be formed at some locations therebetween. The pads 904e are positioned over the conductive printed circuit layer. Here, the sidewalls 904f are formed at the two lateral sides (not the root side and tip side) of each inner pad 904e but with only an inner sidewall on each outer pad 904e-1, to allow a mask (see, e.g., mask 906 of FIGS. 9B-C) to effectively function as one sidewall barrier for each outer pad 904e-1. According to this embodiment, the sidewalls 904f do not extend to the tip side edge and do not extend to the root side edge of the pad 904e, as depicted, to allow for mask positioning.

Figure 9B:
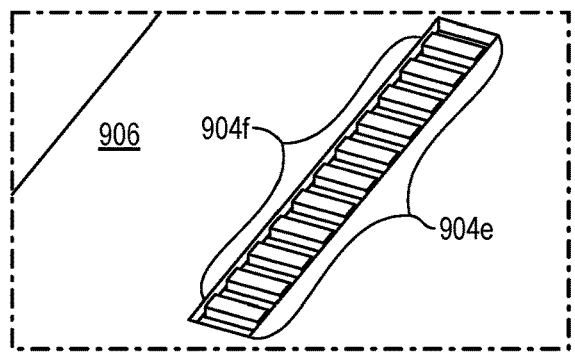
Figure 9C:
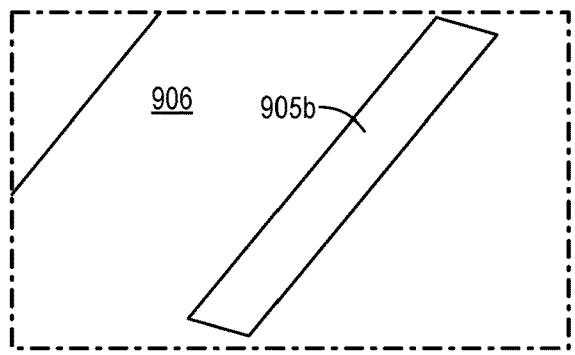
Figure 9D:
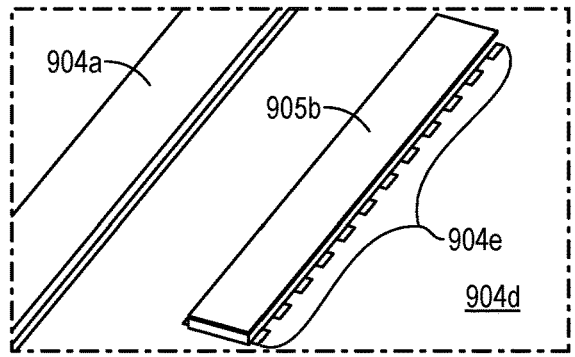

FIG. 9B depicts a masking stage, in which a mask 906 (e.g., composed of a metal material or a photoresist) is applied over a portion of the cover layer 904d and the metal substrate 904a, for solder patterning purposes. FIG. 9C depicts a solder printing or pasting stage, in which solder paste 905b is applied (e.g., printed) to the flexure through the mask 906. FIG. 9D depicts a mask removal stage, in which the mask 906 is removed according to conventional manufacturing process techniques, to uncover and again reveal the cover layer 904d, the metal substrate 904a, and the pads 904e with the solder paste 905b applied thereover.

Figure 9E:
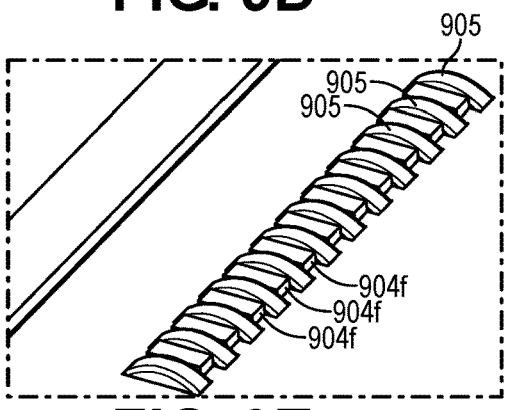

FIG. 9E depicts a solder reflow stage, in which pre-solder bumps 905 (only a subset labeled here, for clarity) are formed over each electrical pad 904e (no longer visible here) and between the respective sidewalls 904f (only a subset labeled here, for clarity) of the flexure. The solder paste 905b over each pad 904e, at the gap between each outer pad 904e-1 and the mask 906, and on top of each sidewall 904f are agglomerated to form the pre-solder bumps 905 on each pad 904e in this reflow process. From that point in the multi-stage process of FIG. 9, slider attaching/bonding and pad connection may be performed as described elsewhere herein (see, e.g., FIG. 4C-D).

Figure 10A:
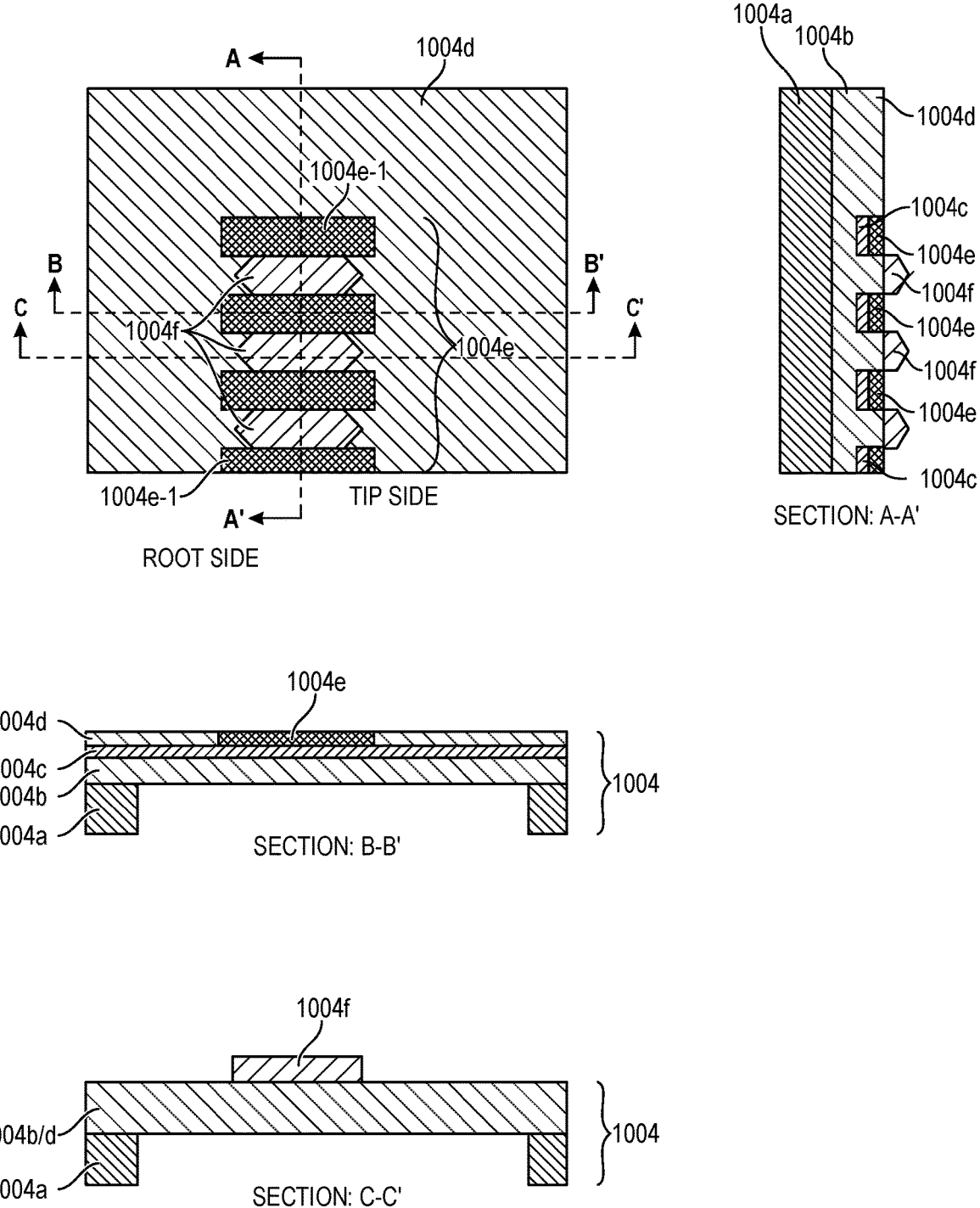
FIG. 10A-C are diagrams illustrating a multi-stage shaped-sidewall pre-solder solder paste and reflow process for a flexure assembly, according to an embodiment.
Figure 10B:
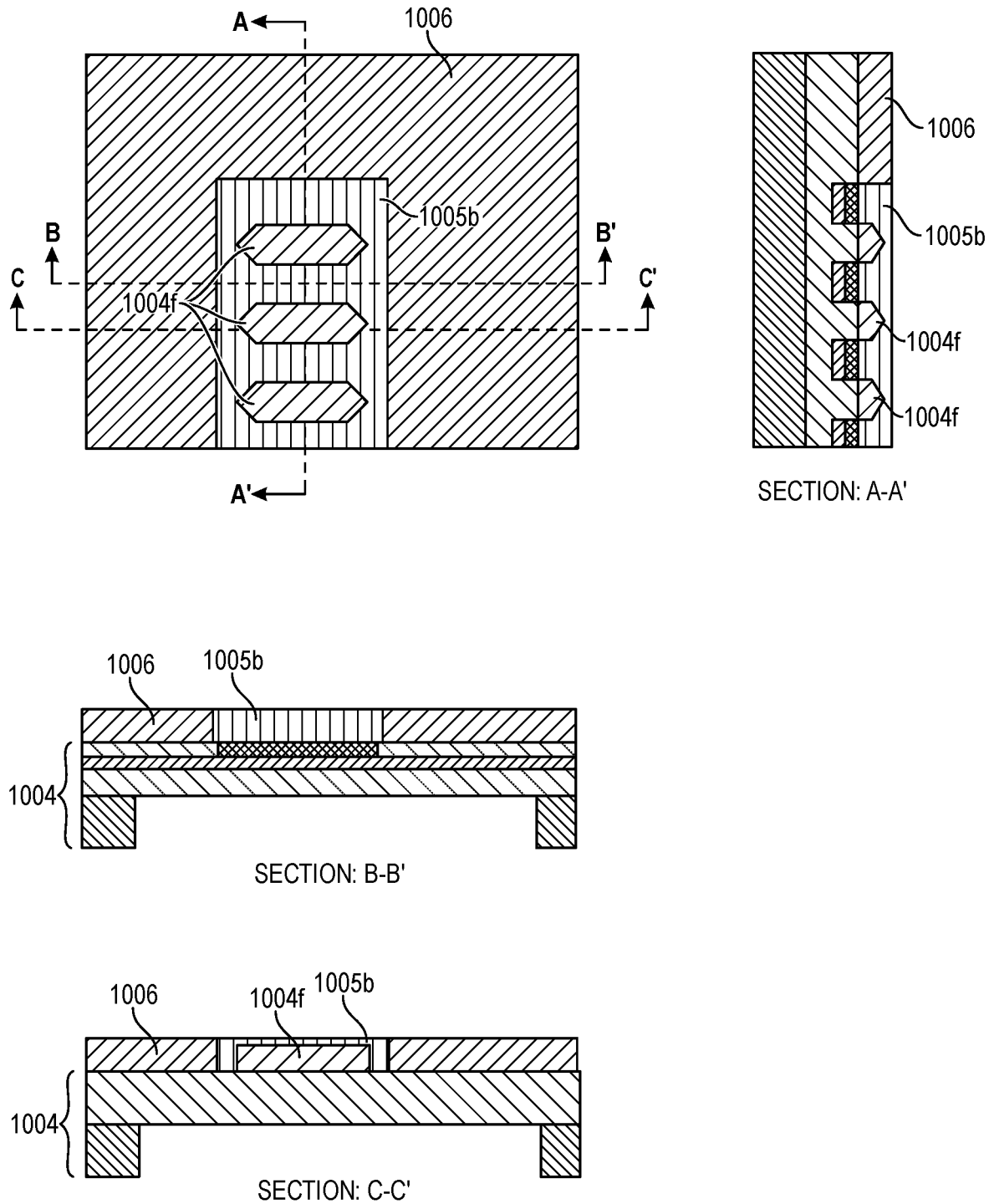
Figure 10C:
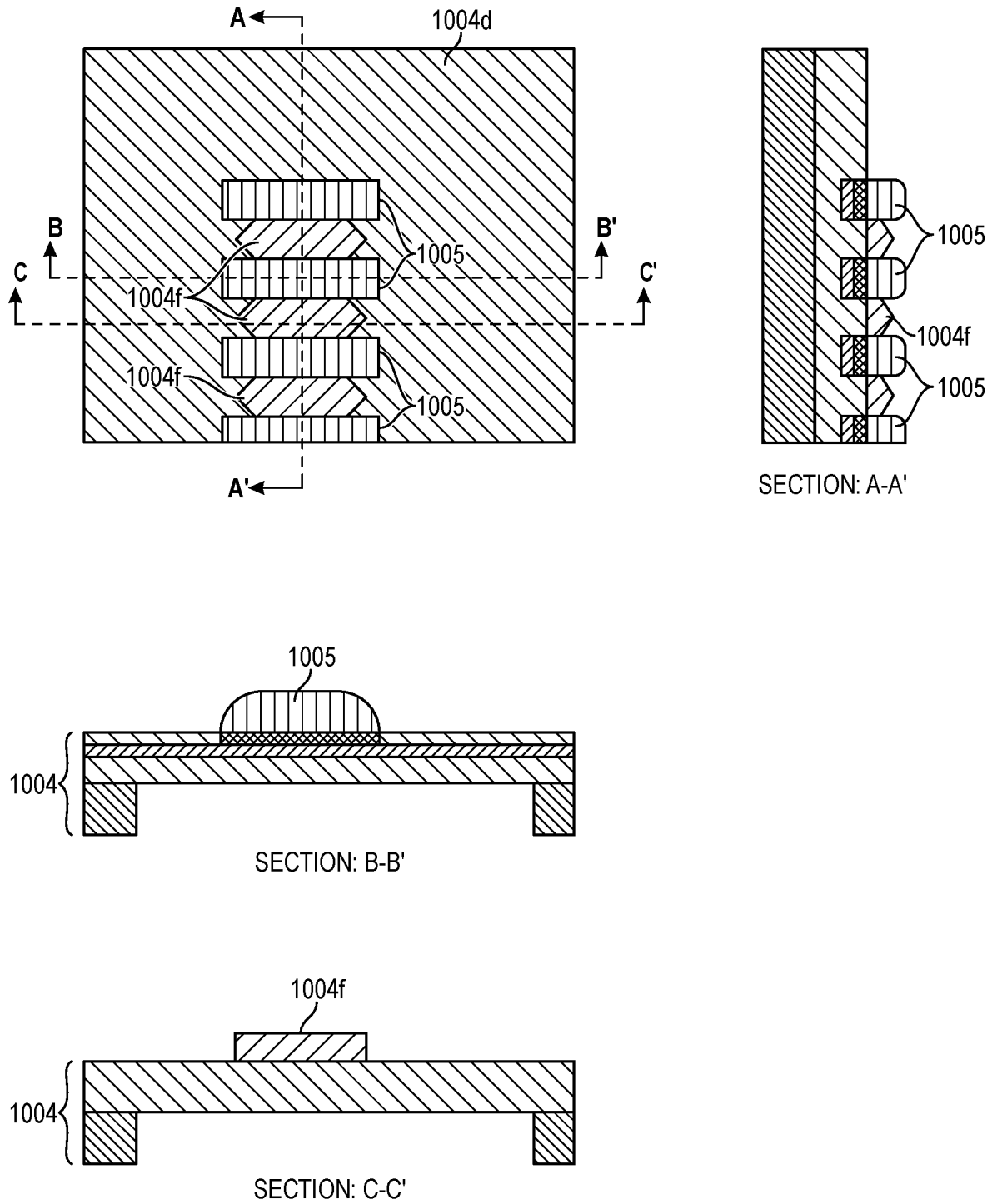

FIG. 10A-C are diagrams illustrating a multi-stage shaped-sidewall pre-solder solder paste and reflow process for a flexure assembly, according to an embodiment. FIG. 10A depicts a flexure forming stage, in which a sidewall layer 1004f (or generally, "sidewalls 1004f"), e.g., a polyimide (PI) polymer layer, comprising a plurality of sidewalls 1004f are formed on each lateral side of each inner flexure electrical pad 1004e (here, a head-pad) but with only an inner sidewall on each outer pad 1004e-1, where each pad 1004e has a root side and a tip side as shown and the set of pads 1004e are laid out in a lateral direction. The sidewalls 1004f are positioned over an insulative cover layer 1004d (e.g., a PI layer) over a metal substrate 1004a (e.g., an etched stainless steel (SST) layer), where a conductive printed circuit layer 1004c and an insulative base layer 1004b may be formed at some locations therebetween. The pads 1004e are positioned over the conductive printed circuit layer 1004c. Here, the sidewalls 1004f are formed at the two lateral sides (not the root side and tip side) of each inner pad 1004e but with only an inner sidewall on each outer pad 1004e-1, to allow a mask (see, e.g., mask 1006 of FIGS. 10B) to effectively function as one sidewall barrier for each outer pad 1004e-1. According to this embodiment, each sidewall 1004f is configured with a tapered (or rounded) shape at each end of the sidewall 1004f, and a tapered (or rounded) shape on the top surface of the sidewall 1004f, as depicted. According to this embodiment, the sidewalls 1004f do not extend to the tip side edge and do not extend to the root side edge of the pad 1004e, as depicted.

FIG. 10B depicts the masking stage, in which a mask 1006 (e.g., composed of a metal material or a photoresist) is applied over a portion of the cover layer 1004d and the metal substrate 1004a, for solder patterning purposes, and the solder printing or pasting stage, in which solder paste 1005b is applied (e.g., printed) to the flexure 1004 through the mask 1006.

FIG. 10C depicts the mask removal stage, in which the mask 1006 is removed according to known manufacturing process techniques to uncover and again reveal the cover layer 1004d, and the solder reflow stage, in which pre-solder bumps 1005 are formed over each electrical pad 1004e (no longer visible here) and between the respective sidewalls 1004f of the flexure 1004. Again, the solder paste 1005b over each pad 1004e and on top of each sidewall 1004f is more readily agglomerated to form the pre-solder bumps 1005 on each pad 1004e in this reflow process employing the shaped-sidewall. From that point in the multi-stage process of FIG. 10, slider attaching/bonding and pad connection may be performed as described elsewhere herein (see, e.g., FIG. 4C-D).

Physical Description of an Illustrative Operating Context

Embodiments may be used in the context of a digital data storage device (DSD) such as a hard disk drive (HDD). Thus, in accordance with an embodiment, a plan view illustrating a conventional HDD 100 is shown in FIG. 1 to aid in describing how a conventional HDD typically operates.

FIG. 1 illustrates the functional arrangement of components of the HDD 100 including a slider 110b that includes a magnetic read-write head 110a. Collectively, slider 110b and head 110a may be referred to as a head slider. The HDD 100 includes at least one head gimbal assembly (HGA) 110 including the head slider, a lead suspension 110c attached to the head slider typically via a flexure, and a load beam 110d attached to the lead suspension 110c. The HDD 100 also includes at least one recording medium 120 rotatably mounted on a spindle 124 and a drive motor (not visible) attached to the spindle 124 for rotating the medium 120. The read-write head 110a, which may also be referred to as a transducer, includes a write element and a read element for respectively writing and reading information stored on the medium 120 of the HDD 100. The medium 120 or a plurality of disk media may be affixed to the spindle 124 with a disk clamp 128.

The HDD 100 further includes an arm 132 attached to the HGA 110, a carriage 134, a voice-coil motor (VCM) that includes an armature 136 including a voice coil 140 attached to the carriage 134 and a stator 144 including a voice-coil magnet (not visible). The armature 136 of the VCM is attached to the carriage 134 and is configured to move the arm 132 and the HGA 110 to access portions of the medium 120, all collectively mounted on a pivot shaft 148 with an interposed pivot bearing assembly 152. In the case of an HDD having multiple disks, the carriage 134 may be referred to as an "E-block," or comb, because the carriage is arranged to carry a ganged array of arms that gives it the appearance of a comb.

An assembly comprising a head gimbal assembly (e.g., HGA 110) including a flexure to which the head slider is coupled, an actuator arm (e.g., arm 132) and/or load beam to which the flexure is coupled, and an actuator (e.g., the VCM) to which the actuator arm is coupled, may be collectively referred to as a head-stack assembly (HSA). An HSA may, however, include more or fewer components than those described. For example, an HSA may refer to an assembly that further includes electrical interconnection components. Generally, an HSA is the assembly configured to move the head slider to access portions of the medium 120 for read and write operations.

With further reference to FIG. 1, electrical signals (e.g., current to the voice coil 140 of the VCM) comprising a write signal to and a read signal from the head 110a, are transmitted by a flexible cable assembly (FCA) 156 (or "flex cable", or "flexible printed circuit" (FPC)). Interconnection between the flex cable 156 and the head 110a may include an arm-electronics (AE) module 160, which may have an on-board pre-amplifier for the read signal, as well as other read-channel and write-channel electronic components. The AE module 160 may be attached to the carriage 134 as shown. The flex cable 156 may be coupled to an electrical-connector block 164, which provides electrical communication, in some configurations, through an electrical feed-through provided by an HDD housing 168. The HDD housing 168 (or "enclosure base" or "baseplate" or simply "base"), in conjunction with an HDD cover, provides a semi-sealed (or hermetically sealed, in some configurations) protective enclosure for the information storage components of the HDD 100.

Other electronic components, including a disk controller and servo electronics including a digital-signal processor (DSP), provide electrical signals to the drive motor, the voice coil 140 of the VCM and the head 110a of the HGA 110. The electrical signal provided to the drive motor enables the drive motor to spin providing a torque to the spindle 124 which is in turn transmitted to the medium 120 that is affixed to the spindle 124. As a result, the medium 120 spins in a direction 172. The spinning medium 120 creates a cushion of air that acts as an air-bearing on which the air-bearing surface (ABS) of the slider 110b rides so that the slider 110b flies above the surface of the medium 120 without making contact with a thin magnetic-recording layer in which information is recorded. Similarly in an HDD in which a lighter-than-air gas is utilized, such as helium for a non-limiting example, the spinning medium 120 creates a cushion of gas that acts as a gas or fluid bearing on which the slider 110b rides.

The electrical signal provided to the voice coil 140 of the VCM enables the head 110a of the HGA 110 to access a track 176 on which information is recorded. Thus, the armature 136 of the VCM swings through an arc 180, which enables the head 110a of the HGA 110 to access various tracks on the medium 120. Information is stored on the medium 120 in a plurality of radially nested tracks arranged in sectors on the medium 120, such as sector 184. Correspondingly, each track is composed of a plurality of sectored track portions (or "track sector") such as sectored track portion 188. Each sectored track portion 188 may include recorded information, and a header containing error correction code information and a servo-burst-signal pattern, such as an ABCD-servo-burst-signal pattern, which is information that identifies the track 176. In accessing the track 176, the read element of the head 110a of the HGA 110 reads the servo-burst-signal pattern, which provides a position-error-signal (PES) to the servo electronics, which controls the electrical signal provided to the voice coil 140 of the VCM, thereby enabling the head 110a to follow the track 176. Upon finding the track 176 and identifying a particular sectored track portion 188, the head 110a either reads information from the track 176 or writes information to the track 176 depending on instructions received by the disk controller from an external agent, for example, a microprocessor of a computer system.

An HDD's electronic architecture comprises numerous electronic components for performing their respective functions for operation of an HDD, such as a hard disk controller ("HDC"), an interface controller, an arm electronics module, a data channel, a motor driver, a servo processor, buffer memory, etc. Two or more of such components may be combined on a single integrated circuit board referred to as a "system on a chip" ("SOC"). Several, if not all, of such electronic components are typically arranged on a printed circuit board that is coupled to the bottom side of an HDD, such as to HDD housing 168.

References herein to a hard disk drive, such as HDD 100 illustrated and described in reference to FIG. 1, may encompass an information storage device that is at times referred to as a "hybrid drive". A hybrid drive refers generally to a storage device having functionality of both a traditional HDD (see, e.g., HDD 100) combined with solid-state storage device (SSD) using non-volatile memory, such as flash or other solid-state (e.g., integrated circuits) memory, which is electrically erasable and programmable. As operation, management and control of the different types of storage media typically differ, the solid-state portion of a hybrid drive may include its own corresponding controller functionality, which may be integrated into a single controller along with the HDD functionality. A hybrid drive may be architected and configured to operate and to utilize the solid-state portion in a number of ways, such as, for non-limiting examples, by using the solid-state memory as cache memory, for storing frequently-accessed data, for storing I/O intensive data, and the like. Further, a hybrid drive may be architected and configured essentially as two storage devices in a single enclosure, i.e., a traditional HDD and an SSD, with either one or multiple interfaces for host connection.

Extensions and Alternatives

In the foregoing description, embodiments of the invention have been described with reference to numerous specific details that may vary from implementation to implementation. Therefore, various modifications and changes may be made thereto without departing from the broader spirit and scope of the embodiments. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

In addition, in this description certain process steps may be set forth in a particular order, and alphabetic and alphanumeric labels may be used to identify certain steps. Unless specifically stated in the description, embodiments are not necessarily limited to any particular order of carrying out such steps. In particular, the labels are used merely for convenient identification of steps, and are not intended to specify or require a particular order of carrying out such steps.

What is claimed is:

1. A flexure for a suspension assembly for a hard disk drive (HDD), the flexure comprising:
   an insulative base layer;
   a first conductive layer over at least a portion of the base layer;
   a plurality of electrical pads each comprising a second conductive layer over the first conductive layer;
   a sidewall layer over a cover layer over the first conductive layer, the sidewall layer comprising:
      a first sidewall adjacent to one side of and extending higher than a corresponding electrical pad of the plurality of electrical pads, and
      a second sidewall adjacent to an opposing side of and extending higher than the corresponding electrical pad; and
   a pre-solder bump of solder material positioned over and in contact with each of the electrical pads and substantially between each respective first and second sidewalls.

2. The flexure of claim 1, the sidewall layer further comprising:
   a root portion extending along a root end of the plurality of electrical pads.

3. The flexure of claim 1, wherein:
   each first and second sidewall comprises a tip end that extends beyond a tip end of the corresponding electrical pad.

4. The flexure of claim 3, wherein:
each pre-solder bump extends beyond the tip end of the corresponding electrical pad.

5. The flexure of claim 3, wherein:
each first and second sidewall comprises a root end that extends beyond a root end of the corresponding electrical pad.

6. The flexure of claim 5, further comprising:
a step structure positioned by at least one of the tip end and the root end of the plurality of electrical pads and having a height greater than that of the electrical pads and less than that of the first and second sidewalls.

7. The flexure of claim 6, wherein:
each pre-solder bump extends onto each step structure.

8. The flexure of claim 1, further comprising:
a step structure positioned along a tip end of the plurality of electrical pads and having a height greater than that of the electrical pads and less than that of the first and second sidewalls.

9. The flexure of claim 8, wherein:
each pre-solder bump extends beyond the tip end of the corresponding electrical pad and onto the step structure.

10. The flexure of claim 1, wherein each first and second sidewall comprises:
a tip end that does not extend to a tip end of the corresponding electrical pad; and
a root end that does not extend to a root end of the corresponding electrical pad.

11. The flexure of claim 10, wherein each tip end and root end of each first and second sidewall has a tapered or rounded shape.

12. The flexure of claim 11, wherein a top surface of each first and second sidewall has a tapered or rounded shape.

13. The flexure of claim 10, wherein a top surface of each first and second sidewall has a tapered or rounded shape.

14. A method for manufacturing a flexure assembly for a hard disk drive, the method comprising:
forming an insulative base layer;
forming a first conductive layer over at least a portion of the base layer;
forming a plurality of electrical pads each comprising a second conductive layer over the first conductive layer;
forming a sidewall layer over a cover layer over the first conductive layer, the sidewall layer comprising:
a first sidewall adjacent to one side of and extending higher than a corresponding electrical pad of the plurality of electrical pads, and
a second sidewall adjacent to an opposing side of and extending higher than the corresponding electrical pad,
forming a pre-solder bump of solder material positioned over and in contact with each of the electrical pads and substantially between each respective first and second sidewalls.

15. The method of claim 14, wherein forming the pre-solder bump includes forming the pre-solder bump employing a solder plating process.

16. The method of claim 14, wherein forming the pre-solder bump includes forming the pre-solder bump employing a solder paste printing and reflow process.

17. The method of claim 14, further comprising:
electrically connecting the plurality of electrical pads to corresponding electrical pads of a head slider employing laser irradiation of the pre-solder bumps.

18. A hard disk drive (HDD) comprising:
a disk medium rotatably mounted on a spindle;
a suspension assembly comprising a flexure comprising:
an insulative base layer,
a first conductive layer over at least a portion of the base layer,
a plurality of electrical pads each comprising a second conductive layer over the first conductive layer,
a sidewall layer over a cover layer over the first conductive layer, the sidewall layer comprising:
a first sidewall adjacent to one side of and extending higher than a corresponding electrical pad of the plurality of electrical pads, and
a second sidewall adjacent to an opposing side of and extending higher than the corresponding electrical pad, and
a pre-solder bump of solder material positioned over and in contact with each of the electrical pads and substantially between each respective first and second sidewalls;
a head slider housing a read-write transducer configured to read from and to write to the disk medium, the head slider mounted on the suspension assembly and electrically connected to the plurality of electrical pads of the flexure via the pre-solder bumps; and
means for moving the head slider to access portions of the disk medium.

19. The HDD of claim 18, wherein the sidewall layer of the flexure further comprises a root portion extending along a root end of the plurality of electrical pads.

20. The HDD of claim 18, wherein:
each first and second sidewall comprises a tip end that extends beyond a tip end of the corresponding electrical pad; and
each pre-solder bump extends beyond the tip end of the corresponding electrical pad.

21. The HDD of claim 20, wherein:
each first and second sidewall comprises a root end that extends beyond a root end of the corresponding electrical pad;
the flexure further comprises a step structure positioned by at least one of the tip end and the root end of the plurality of electrical pads and having a height greater than that of the electrical pads and less than that of the first and second sidewalls; and
each pre-solder bump extends onto each step structure.

22. The HDD of claim 18, wherein:
the flexure further comprises a step structure positioned along a tip end of the plurality of electrical pads and having a height greater than that of the electrical pads and less than that of the first and second sidewalls; and
each pre-solder bump extends beyond the tip end of the corresponding electrical pad and onto the step structure.

23. The HDD of claim 18, wherein:
each first and second sidewall comprises:
a tip end that does not extend to a tip end of the corresponding electrical pad, and
a root end that does not extend to a root end of the corresponding electrical pad;
each tip end and root end of each first and second sidewall has a tapered or rounded shape; and
a top surface of each first and second sidewall has a tapered or rounded shape.

* * * * *